(12) United States Patent
Kato et al.

(10) Patent No.: US 9,401,495 B2
(45) Date of Patent: Jul. 26, 2016

(54) LUMINESCENT ELEMENT AND LIGHTING DEVICE USING THE SAME

(71) Applicant: Panasonic Intellectual Property Management Co., Ltd., Osaka (JP)

(72) Inventors: Daiki Kato, Osaka (JP); Toshihiro Higuchi, Osaka (JP); Mitsuo Yaguchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/552,958

(22) Filed: Nov. 25, 2014

(65) Prior Publication Data

US 2015/0155512 A1 Jun. 4, 2015

(30) Foreign Application Priority Data

Dec. 3, 2013 (JP) .................. 2013-250386

(51) Int. Cl.
*H01L 51/52* (2006.01)

(52) U.S. Cl.
CPC ........ *H01L 51/5228* (2013.01); *H01L 51/5212* (2013.01); *H01L 2251/5361* (2013.01)

(58) Field of Classification Search
None
See application file for complete search history.

(56) References Cited

U.S. PATENT DOCUMENTS

| 2007/0096112 A1* | 5/2007 | Hoshi | H01L 51/52 257/79 |
| 2008/0129193 A1 | 6/2008 | Asabe et al. | |
| 2012/0306410 A1* | 12/2012 | Kono | H01L 33/38 315/362 |

FOREIGN PATENT DOCUMENTS

JP    2008-130449    6/2008

\* cited by examiner

*Primary Examiner* — Charles Garber
*Assistant Examiner* — Alia Sabur
(74) *Attorney, Agent, or Firm* — Renner, Otto, Boisselle & Sklar, LLP

(57) ABSTRACT

A luminescent element includes a first electrode layer, a functional layer including an emitting layer and being disposed on the first electrode layer, a conductive layer permitting transmission of light and being disposed on the functional layer, and a first patterned electrode and a second patterned electrode each having an opening and being disposed on the conductive layer to be separated from each other. The conductive layer extends from a first area in which the first patterned electrode is disposed on the conductive layer to a second area in which the second patterned electrode is disposed on the conductive layer.

10 Claims, 15 Drawing Sheets

LUMINESCENT ELEMENT AND LIGHTING DEVICE USING THE SAME

This application claims priority to Japanese Patent Application No. 2013-250386, filed on Dec. 3, 2013, the contents of which are hereby incorporated by reference.

BACKGROUND

1. Technical Field

The present disclosure relates to a luminescent element that uses the phenomenon of electroluminescence of organic materials and a lighting device using the luminescent element.

2. Description of the Related Art

In recent years, organic electro-luminescence (EL) luminescent elements that use the phenomenon of electroluminescence of organic materials have been proposed as luminescent elements used for lighting devices, display devices, and the like.

Organic EL luminescent elements are known to have a typical structure in which an anode disposed on a substrate, a functional layer including an emitting layer made of an organic luminescent material, and a cathode are laminated.

SUMMARY

In recent years, lighting devices have become multifunctional and the design of lighting devices has become sophisticated. For example, lighting devices need to have a function of selectively achieving various sizes and positions of luminescent areas in a single luminescent element.

One non-limiting and exemplary embodiment provide a luminescent element that has a plurality of luminescent areas and allows the plurality of luminescent areas to independently emit light in a simple structure constituted by a single luminescent element. Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

A luminescent element according to an aspect of the present disclosure includes a first electrode layer; a functional layer including an emitting layer and being disposed on the first electrode layer; a conductive layer permitting transmission of light and being disposed on the functional layer; and a first patterned electrode and a second patterned electrode each having an opening and being disposed on the conductive layer to be separated from each other. The conductive layer extends from a first area in which the first patterned electrode is disposed on the conductive layer to a second area in which the second patterned electrode is disposed on the conductive layer.

Note that comprehensive or specific aspects of the present disclosure may include lighting devices, lighting systems, electronic devices, and methods. Comprehensive or specific aspects of the present disclosure may further include desired combinations of lighting devices, lighting systems, electronic devices, and methods.

DETAILED DESCRIPTION

Figure 1:
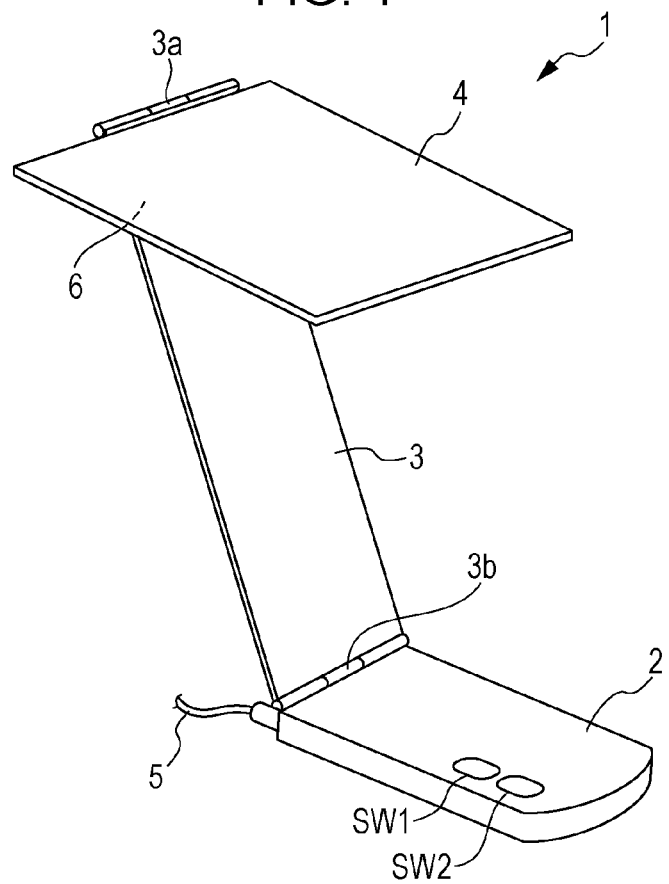
FIG. 1 is an external view of a lighting device according to a first embodiment.

Underlying Knowledge Forming Basis of the Present Disclosure

In recent years, lighting devices have become multifunctional and the design of lighting devices has become sophisticated. Lighting devices need to have a function of selectively achieving various sizes and positions of luminescent areas in a single luminescent element. To reduce the cost, such a function needs to be realized in a simple structure.

For example, in the lighting devices described above, the entire surface of an organic luminescent layer can be simultaneously made to emit light. However, it is difficult for part of an organic luminescent layer to selectively emit light or for a plurality of luminescent areas disposed in an organic luminescent layer so as to independently emit light to individually emit light.

The inventors have conducted studies on a method for realizing a single luminescent element that includes a plurality of luminescent areas and that allows the luminescent areas to independently emit light. One method for allowing part of an organic luminescent layer to selectively emit light may be to partition one electrode. However, this poses a new problem in that boundaries between areas formed by partitioning one electrode, that is, between a plurality of luminescent areas are visually recognized in a light-off state, which is problematic as a commodity product in terms of appearance. When a reflecting electrode is partitioned, the cause of the problem is assumed to be due to the difference in reflectance as a result of the presence or absence of the reflecting electrode. When a transparent electrode is partitioned, the cause is assumed to be due to the refractive-index step as a result of the presence or absence of the transparent electrode.

The present disclosure provides a luminescent element that allows a plurality of luminescent areas to selectively emit light and a lighting device in which boundaries between the plurality of luminescent areas are not easily visually recognized in a light-off state and which has good designability.

Summary of Embodiments of the Present Disclosure

A luminescent element according to an embodiment includes a first electrode layer; a functional layer including an emitting layer and being disposed on the first electrode layer; a conductive layer permitting transmission of light and being disposed on the functional layer; and a first patterned electrode and a second patterned electrode each having an opening and being disposed on the conductive layer to be separated from each other. The conductive layer extends from a first area in which the first patterned electrode is disposed on the conductive layer to a second area in which the second patterned electrode is disposed on the conductive layer.

In this structure, a plurality of luminescent areas can be made to each independently emit light using a simple structure including a single luminescent element. Since the conductive layer is continuously disposed over the plurality of luminescent areas, the boundaries between the plurality of luminescent areas are not easily visually recognized in a light-off state. Thus, the designability can be improved.

In another embodiment, the conductive layer may be continuously disposed over the first area, the second area, and the third area sandwiched between the first area and the second area.

In another embodiment, the luminescent element may further include a first insulating layer being disposed on the conductive layer in the third area. At least one of the first patterned electrode and the second patterned electrode may extend to the third area. And an extended portion of the at least one of the first patterned electrode and the second patterned electrode may be disposed on the first insulating layer and not on the conductive layer in the third area.

In this structure, a part of the first patterned electrode or the second patterned electrode disposed on the first insulating layer does not function as an auxiliary electrode because the part does not directly contact the conductive layer. In other words, such a part of the first patterned electrode or the second patterned electrode disposed on the first insulating layer does not function as an electrode. Therefore, even if the distance between the first patterned electrode and the second patterned electrode is decreased, the luminescent areas can be separated from each other with certainty. By decreasing the distance between the first patterned electrode and the second patterned electrode in plan view to the extent that the distance cannot be visually recognized, the separation section between the first patterned electrode and the second patterned electrode can be obscured. Therefore, the luminescent areas are not easily distinguished when the luminescent surface is viewed from the outside in a light-off state. Consequently, the luminescent surface becomes visually uniform and the designability can be improved.

In another embodiment, the luminescent element may further include a patterned insulation portion having an insulating property and being disposed on the conductive layer in the third area. The patterned insulation portion may have a pattern connected to patterns of the first patterned electrode and the second patterned electrode in plan view.

In this structure, the pattern discontinuity between the first patterned electrode and the second patterned electrode can be obscured. Therefore, the boundaries between the luminescent areas are not easily visually recognized when the luminescent surface is viewed from the outside in a light-off state. This provides a uniform appearance and the designability can be improved.

In another embodiment, the luminescent element may further include a second insulating layer being disposed between the conductive layer and the first electrode layer in the third area.

In this structure, a current path from the conductive layer to the first electrode layer can be cut off with certainty in a area where the second insulating layer is present. This can restrict the light emission with certainty. Thus, the outline of the luminescent area can be sharpened during light emission.

In another embodiment, the second insulating layer may extend to at least one of the first area and the second area and may have one or more openings in the at least one of the first area and the second area.

In this structure, areas corresponding the openings of the second insulating layer can be made to emit light. Furthermore, the outline of each luminescent area can be sharpened during light emission.

In another embodiment, the first electrode layer may be a light reflecting electrode.

A lighting device according to an embodiment includes any one of the above described luminescent elements and a drive circuit electrically connected to the first patterned electrode and the second patterned electrode and configured to independently supply an electric current to the first patterned electrode and the second patterned electrode.

In this structure, there can be provided a lighting device including a plurality of luminescent areas that can be made to each independently emit light using a simple structure including a single luminescent element. There can also be provided a lighting device in which the boundaries between the plurality of luminescent areas are not easily visually recognized in a light-off state and thus the designability is improved.

First Embodiment

A lighting device 1 according to a first embodiment will be described with reference to FIGS. 1 to 9C.

Structure of Lighting Device 1

FIG. 1 is an external view of the lighting device 1 according to the first embodiment. The lighting device 1 is a desk light-type lighting device and includes a base unit 2, an arm unit 3, a head unit 4, and a wiring line 5. The lighting device 1 emits light downward.

Base Unit 2

The base unit 2 incorporates drive circuits (drive circuit 7A and drive circuit 7B) for switching on a luminescent element 6.

Two switches (power-on switch SW1 and luminescent area-selecting switch SW2) are disposed on an upper surface of the base unit 2. The wiring line 5 for supplying power to the drive circuit 7A and the drive circuit 7B from the outside is connected to the rear of the base unit 2.

Arm Unit 3

The arm unit 3 includes a coupling portion 3a at one end in a longitudinal direction and a coupling portion 3b at the other end. The coupling portion 3a is coupled with the head unit 4 and the coupling portion 3b is coupled with the base unit 2. The arm unit 3 incorporates a wiring line for electrically connecting the drive circuit 7A and drive circuit 7B to the luminescent element 6 in the head unit 4.

Head Unit 4

Figure 2:
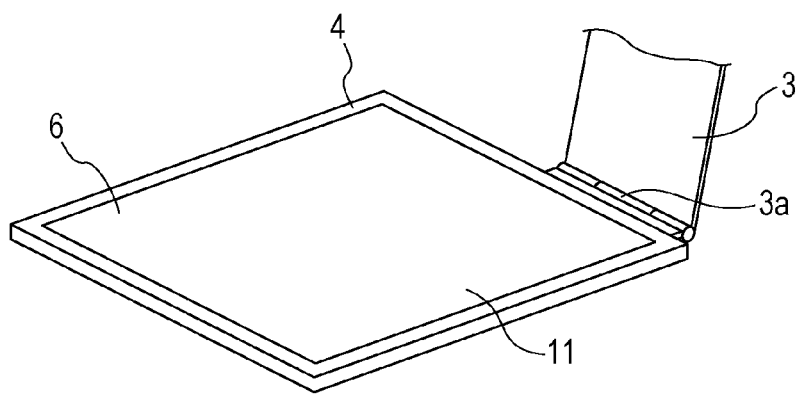
FIG. 2 is a partial external view showing the lighting device according to the first embodiment.

FIG. 2 is a partial external view showing the head unit 4 and its surroundings which are viewed from the lower side of the lighting device 1. The head unit 4 includes the luminescent element 6 serving as an illumination unit of the lighting device 1. Light is emitted from an output surface 11 of the luminescent element 6.

Luminescent Element 6

1. Structure Overview

Figure 3:
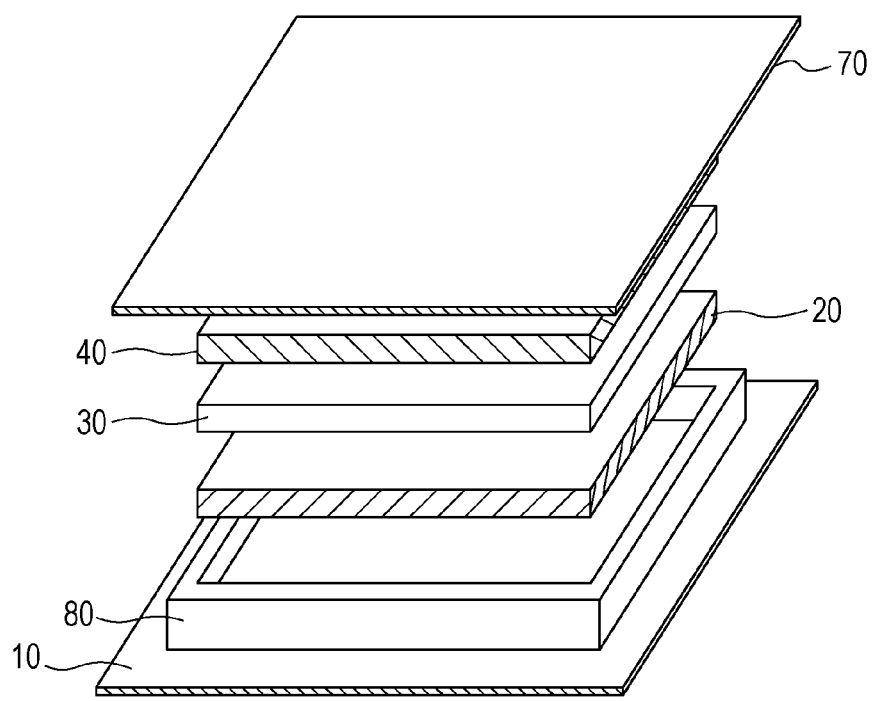
FIG. 3 is an exploded perspective view showing a luminescent element according to the first embodiment.
Figure 4A:
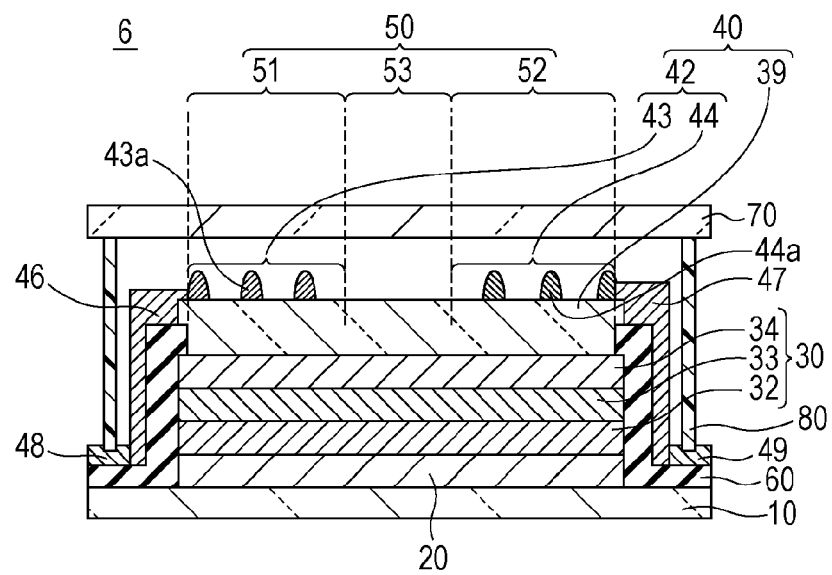
FIG. 4A is a cross-sectional view showing an internal configuration of the luminescent element according to the first embodiment.
Figure 4B:
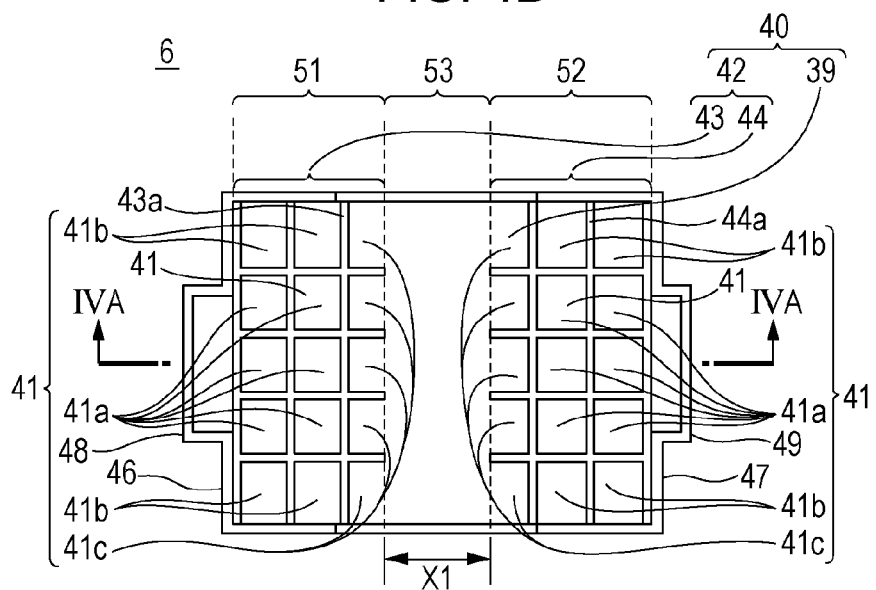
FIG. 4B is a plan view showing the internal configuration of the luminescent element according to the first embodiment.
Figure 5:
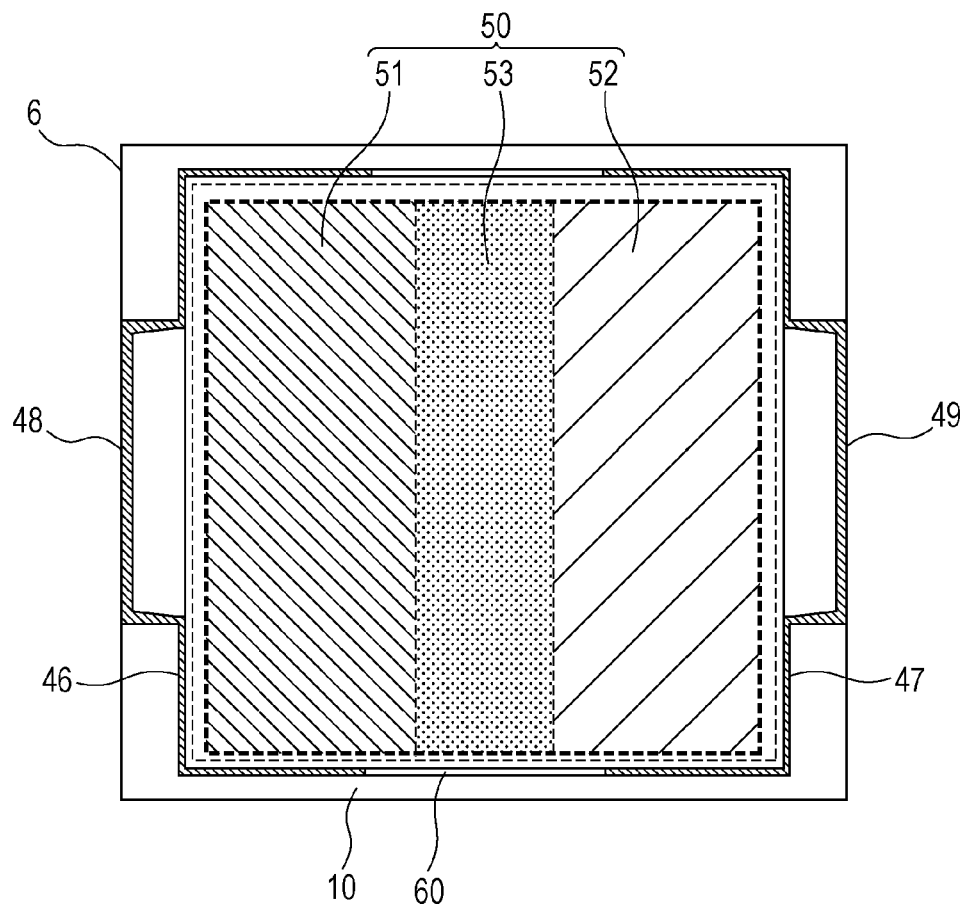
FIG. 5 is a plan view showing the internal configuration of the luminescent element according to the first embodiment.

FIG. 3 is an exploded perspective view showing an overview of an internal configuration of the luminescent element 6. FIGS. 4A and 4B schematically show the internal configuration of the luminescent element 6. FIG. 4A is a cross-sectional view taken along line IVA-IVA of FIG. 4B. FIG. 4B is a plan view showing a state excluding a sealing substrate 70 and a frame unit 80. FIG. 5 is a schematic plan view showing a state excluding the sealing substrate 70 of the luminescent element 6. In this specification, the direction in which the luminescent element 6 emits light is an upper direction and the direction opposite to the upper direction is a lower direction.

As shown in FIG. 3, the luminescent element 6 includes a multi-layer film in which a first electrode layer 20, a functional layer 30 including an emitting layer, and a second electrode layer 40 are laminated on a substrate 10 in that order. The multi-layer film is sealed with the substrate 10, a sealing substrate 70, and a frame unit 80 that surrounds the multi-layer film.

As shown in FIGS. 4A and 4B, the second electrode layer 40 includes a transparent conductive layer 39 and a patterned electrode 42. The transparent conductive layer 39 is a light transmissive layer and is disposed on the entire surface of the functional layer 30 so as to be in contact with the functional layer 30. The patterned electrode 42 includes a first patterned electrode 43 and a second patterned electrode 44 each including openings 41. The light emitted from the emitting layer is extracted through the transparent conductive layer 39 and the openings 41 of the first patterned electrode 43 and the second patterned electrode 44.

The first patterned electrode 43 is constituted by wire electrodes 43a. The second patterned electrode 44 is constituted by wire electrodes 44a. The wire electrodes 43a and the wire electrodes 44a are made of a material having an electrical conductivity higher than that of the transparent conductive layer 39. The first patterned electrode 43 and the second patterned electrode 44 are disposed so as to be separated from each other. An area including a portion in which the wire electrodes 43a are formed and the openings 41 defined by the wire electrodes 43a is referred to as an area of the first patterned electrode. The openings 41 defined by the wire electrodes 43a include not only areas 41a surrounded by the wire electrodes 43a, but also areas surrounded by the wire electrodes 43a and outer edges defined by virtual lines that connect the end portions of the wire electrodes 43a in FIG. 4B. For example, areas 41b surrounded by the wire electrodes 43a and outer edges defined by virtual lines that connect the upper end portions of the wire electrodes 43a and that connect the lower end portions of the wire electrodes 43a are also included in the openings 41. Areas 41c surrounded by the wire electrodes 43a and outer edges defined by virtual lines that connect the right end portions of the wire electrodes 43a are also included in the openings 41. Similarly, an area including a portion in which the wire electrodes 44a are formed and the openings 41 defined by the wire electrodes 44a is referred to as an area of the second patterned electrode.

In this specification, an area in which the first patterned electrode 43 is disposed on the transparent conductive layer 39 in plan view is defined as a first area 51. An area in which the second patterned electrode 44 is disposed on the transparent conductive layer 39 in plan view is defined as a second area 52. An area sandwiched between the first area 51 and the second area 52 is defined as a third area 53.

Herein, for example, the case where an insulating layer is disposed in part of an area on the transparent conductive layer 39 and the first patterned electrode 43 is disposed so as to extend from an upper surface of the transparent conductive layer 39 to an upper surface of the insulating layer is assumed. In this case, an area of the first patterned electrode 43 located on the upper surface of the insulating layer is not an area in which the first patterned electrode 43 is disposed on the transparent conductive layer 39. Therefore, this area does not correspond to the first area. On the other hand, an area (including the openings 41) of the first patterned electrode 43 that is disposed directly on the upper surface of the transparent conductive layer 39 without being interposed by the insulating layer is an area in which the first patterned electrode 43 is disposed directly on the transparent conductive layer 39. Therefore, this area corresponds to the first area.

As shown in FIG. 4B, the luminescent element 6 includes a first leader line 46 at the left edge of the first area 51. The first leader line 46 electrically connects the first patterned electrode 43 to a first terminal 48. An insulating layer 60 is disposed between the first leader line 46 and the functional layer 30 and between the first leader line 46 and the first electrode layer 20. Similarly, the luminescent element 6 includes a second leader line 47 at the right edge of the second area 52. The second leader line 47 electrically connects the second patterned electrode 44 to a second terminal 49. An insulating layer 60 is disposed between the second leader line 47 and the functional layer 30 and between the second leader line 47 and the first electrode layer 20.

The luminescent element 6 further includes a first electrode terminal (not shown) electrically connected to the first electrode layer 20.

As shown in FIGS. 4B and 5, the luminescent element 6 includes the first area 51 and the second area 52 in which light can be emitted independently. Note that a area including the first area 51, the second area 52, and the third area 53 sandwiched between the first area 51 and the second area 52 is referred to as a luminescent surface 50.

Figure 6:
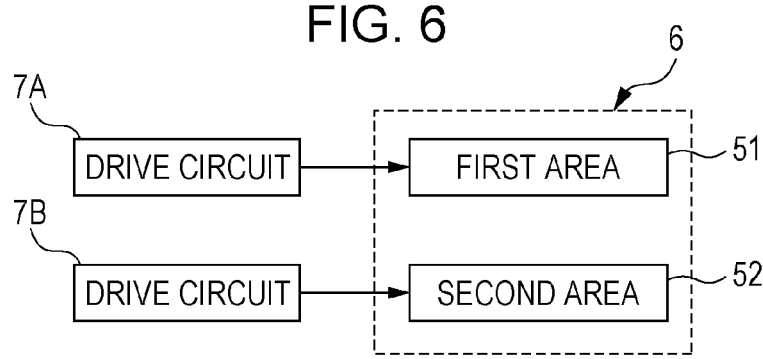
FIG. 6 shows the connection between drive circuits and a luminescent element used in a lighting device according to the first embodiment.

FIG. 6 is a schematic view showing the connection between the drive circuits and the luminescent element 6 used in the lighting device 1. The drive circuits include a drive circuit 7A and a drive circuit 7B that each independently generate an output. The drive circuit 7A is electrically connected to the first terminal 48 and supplies an electric current to the first patterned electrode 43 and the transparent conductive layer 39. The drive circuit 7B is electrically connected to the second terminal 49 and supplies an electric current to the second patterned electrode 44 and the transparent conductive layer 39. When the drive circuit 7A and the drive circuit 7B are each independently driven, the luminescent element 6 can emit light selectively from the first area 51 and the second area 52.

2. Structure of Each Component

Hereafter, each component of the luminescent element 6 will be described in detail.

Substrate 10

The shape of the substrate 10 is not limited to a rectangular shape and may be a shape other than the rectangular shape, such as a polygonal shape or a circular shape. The length and width of the substrate 10 are, for example, about several tens of millimeters to several tens of inches and may be suitably selected in accordance with the required size of the luminescent surface 50, the application, and the scale of manufacturing equipment.

The substrate 10 is made of a material typically used for substrates of organic EL elements, such as glass, plastic, or metal. The substrate 10 may be rigid or flexible.

First Electrode Layer 20

In the luminescent element 6 according to this embodiment, the first electrode layer 20 serves as a cathode and the second electrode layer 40 serves as an anode. The first electrode layer 20 serving as a cathode may be made of an electrode material such as a metal, an alloy, or an electrically conductive compound each having a low work function, or a mixture of the foregoing. A material having a work function of 1.9 eV or more and 5 eV or less may be used so that the difference between the work function and the lowest unoccupied molecular orbital (LUMO) level is not excessively increased.

The first electrode layer 20 may be made of, for example, aluminum, silver, magnesium, gold, copper, chromium, molybdenum, palladium, or tin. The first electrode layer 20 may also be made of an alloy of the foregoing metal and another metal, such as a magnesium-silver mixture, a magnesium-indium mixture, or an aluminum-lithium alloy. The first electrode layer 20 may be a multi-layer film including a thin film made of aluminum and an ultrathin film (e.g., a thin film that has a thickness of 1 nm or less and allows flow of electrons by tunnel injection) made of a metal, a metal oxide, or a mixture of the foregoing metal and another metal, such as aluminum oxide.

The first electrode layer 20 may be formed by a thin-film process such as a vacuum vapor deposition method or by a wet process such as a spin coating method or a dipping method.

In the luminescent element 6, the first electrode layer 20 functions as a reflecting electrode. In this case, the first electrode layer 20 may be made of a material having low resistance and high reflectivity for the light emitted from the functional layer 30. Specifically, the material may be aluminum, silver, or the like In the case where the first electrode layer 20 serves as an anode which is an electrode for injecting holes (second carriers) serving as second charges into the functional layer 30, the first electrode layer 20 may be made of a metal having a high work function. A material having a work function of 4 eV or more and 6 eV or less may be used so that the difference between the work function and the highest occupied molecular orbital (HOMO) level is not excessively increased.

In the luminescent element 6 according to this embodiment, the thickness of the first electrode layer 20 is set to be 80 to 200 nm. However, the thickness is merely an example and is not particularly limited.

Functional Layer 30

(1) Stacked-layer Structure

In the luminescent element 6, the functional layer 30 includes an emitting layer 32, a second carrier transport layer 33, and a second carrier injection layer 34 in that order from the first electrode layer 20 side. Herein, the second carrier transport layer 33 is a hole transport layer and the second carrier injection layer 34 is a hole injection layer.

The functional layer 30 may include at least the emitting layer 32. Layers other than the emitting layer 32, such as a first carrier injection layer, a first carrier transport layer, an interlayer, the second carrier transport layer 33, and the second carrier injection layer 34, may be suitably provided. The emitting layer 32 may have a single layer structure or a multilayer structure. For example, when the desired emission color is white, three types of dopant dyes of red, green, and blue may be doped into the emitting layer. A laminated structure including a blue-color hole transporting emitting layer, a green-color electron transporting emitting layer, and a red-color electron transporting emitting layer may also be employed. Alternatively, a laminated structure including a blue-color electron transporting emitting layer, a green-color electron transporting emitting layer, and a red-color electron transporting emitting layer may be employed.

In the luminescent element 6 according to this embodiment, the thickness of the emitting layer 32 is set to be 60 to 200 nm, the thickness of the second carrier transport layer 33 is set to be 5 to 30 nm, and the thickness of the second carrier injection layer 34 is set to be 10 to 60 nm. However, these thicknesses are merely examples and are not particularly limited.

(2) Material

A) Emitting Layer 32

Examples of the material for the emitting layer 32 include polyparaphenylenevinylene derivatives, polythiophene derivatives, polyparaphenylene derivatives, polysilane derivatives, and polyacetylene derivatives; polyfluorene derivatives, polyvinylcarbazole derivatives, coloring matter, and polymerized metal complex-based light-emitting materials; anthracene, naphthalene, pyrene, tetracene, coronene, perylene, phthaloperylene, naphthaloperylene, diphenyl butadiene, tetraphenylbutadiene, coumarin, oxadiazole, bis-benzoxazoline, bisstyryl, cyclopentadiene, quinoline metal complexes, tris(8-hydroxyquinolinato)aluminum complexes, tris(4-methyl-8-quinolinato)aluminum complexes, tris(5-phenyl-8-quinolinato)aluminum complexes, aminoquinoline metal complexes, benzoquinoline metal complexes, tri-(p-terphenyl-4-yl)amine, pyran, quinacridone, rubrene, and derivatives of the foregoing; and 1-aryl-2,5-di(2-thienyl)pyrrole derivatives, distyrylbenzene derivatives, styrylarylene derivatives, styrylamine derivatives, and compounds partly having a group constituted by such a luminescent compound in a molecule thereof. In addition to the above-described compounds derived from fluorescent dyes, so-called phosphorous luminescent materials may also be used. Examples of the phosphorous luminescent materials include luminescent materials such as iridium complexes, osmium complexes, platinum complexes, and europium complexes; and compounds and polymers having the foregoing complex in a molecule thereof. These materials can be suitably selected as needed. The emitting layer 32 can be formed by a wet process such as a coating method (e.g., spin coating method, spray coating method, die coating method, gravure printing method, and screen printing method). The formation method of the emitting layer 32 is not limited to the coating method. The emitting layer 32 may be formed by a dry process such as a vacuum vapor deposition method or a transfer method.

B) Hole Transport Layer

The hole transport layer may be made of a low-molecular-weight material or a high-molecular-weight material having a low LUMO level. Non-limiting examples of the material include polymers containing aromatic amines, e.g., polyarylene derivatives having an aromatic amine at a side chain or a main chain thereof, such as polyvinylcarbazole (PVCz), polypyridine, and polyaniline. Examples of the material for the hole transport layer include 4,4'-bis[N-(naphthyl)-N-phenyl-amino]biphenyl (α-NPD), N,N'-bis(3-methylphenyl)-(1,1'-bipneyl)-4,4'-diamine (TPD), 2-TNATA, 4,4',4"-tris(N-(3-methylphenyl)N-phenylamino)triphenylamine (MTDATA), 4,4'-N,N'-dicarbazole biphenyl (CBP), Spiro-NPD, spiro-TPD, spiro-TAD, and TNB.

C) Hole Injection Layer

The hole injection layer is made of an organic material such as thiophene, triphenylmethane, hydrazaline, amylamine, hydrazone, stilbene, or triphenylamine. Specific examples of the material include aromatic amine derivatives such as polyvinylcarbazole, polyethylenedioxythiophene:polystyrene sulfonate (PEDOT:PSS), and TPD. These materials may be used alone or in combination of two or more. The hole injection layer made of such a material may be formed by a wet process such as a coating method (e.g., spin coating method, spray coating method, die coating method, and gravure printing method).

Second Electrode Layer 40

As described above, the second electrode layer 40 includes the transparent conductive layer 39 which is a light transmissive layer and is in contact with the functional layer 30 and the patterned electrode 42 having openings 41 for extracting light emitted from the functional layer 30.

A) Transparent Conductive Layer 39

The transparent conductive layer 39 may be made of a conductive polymer material such as polythiophene, polyaniline, polypyrrole, polyphenylene, polyphenylenevinylene, polyacetylene, or polycarbazole. Furthermore, a dopant such as sulfonic acid, Lewis acid, protonic acid, an alkali metal, or an alkaline-earth metal may be doped in order to increase the conductivity. The resistivity of the transparent conductive layer 39 may be further decreased. As the resistivity decreases, the electrical conduction property in a horizontal direction (in-plane direction) is improved. As a result, the in-plane variation in electric current flowing through the emitting layer 32 can be reduced and thus the luminance unevenness can be reduced.

In the luminescent element 6 according to this embodiment, the thickness of the transparent conductive layer 39 is set to be 200 to 400 nm. However, the thickness is merely an example and is not particularly limited.

B) Patterned Electrode 42

B-1) Material

The wire electrodes 43a and 44a of the patterned electrode 42 contain a powder of a metal and an organic binder. The metal may be, for example, silver, gold, or copper. Thus, the resistivity and sheet resistance of the patterned electrode 42 can be made lower than an electrode made of a conductive transparent oxide. Consequently, the luminance unevenness of the luminescent element 6 can be reduced. The conductive material for the wire electrodes 43a and 44a of the patterned electrode 42 may be an alloy, carbon black, or the like instead of the metal.

The wire electrodes 43a and 44a of the patterned electrode 42 can be formed by, for example, printing a paste (printing ink) prepared by mixing an organic binder and an organic solvent in a metal powder using a screen printing method, a gravure printing method, or the like. Examples of the organic binder include acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, diallyl phthalate resin, cellulose resin, polyvinyl chloride, polyvinylidene chloride, polyvinyl acetate, and other thermoplastic resins. A copolymer of two or more of monomers that constitute the above resins may be used. The organic binder is not limited thereto.

B-2) Dimensions and Shape

The first patterned electrode 43 and the second patterned electrode 44 are formed in a grid-like (net-like) manner as shown in FIG. 4B so as to form a plurality of rectangular openings 41 (in the example shown in FIG. 4B, 5×3=15 for each of the patterned electrodes).

Figure 7A:
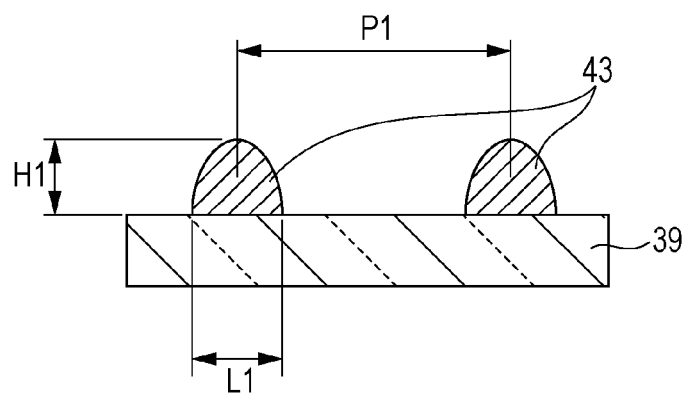
FIG. 7A is an enlarged sectional view showing a first patterned electrode of the luminescent element according to the first embodiment.
Figure 7B:
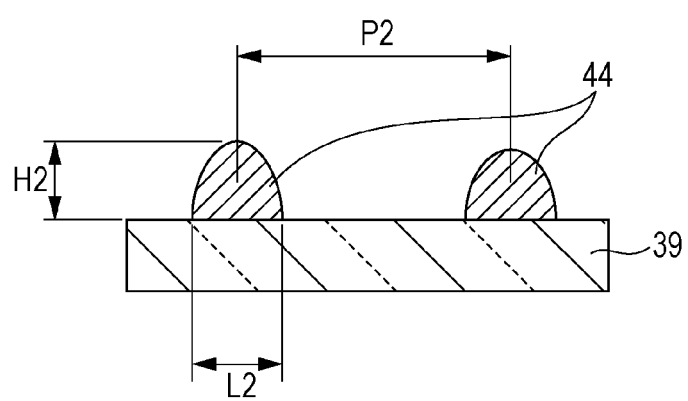
FIG. 7B is an enlarged sectional view showing a second patterned electrode of the luminescent element according to the first embodiment.

FIG. 7A is an enlarged sectional view showing the first patterned electrode 43. FIG. 7B is an enlarged sectional view showing the second patterned electrode 44.

As shown in FIG. 7A, the dimensions of the pattern of the wire electrodes 43a of the first patterned electrode 43 are as follows. For example, the wire width L1 may be 1 μm to 100 μm, the height H1 may be 50 nm to 100 μm, and the pitch P1 may be 100 μm to 2500 μm. When the pitch P1 is in the above range, light is uniformly emitted from the entire surface of the first area 51 constituted by the first patterned electrode 43 including the openings 41.

Similarly, as shown in FIG. 7B, the dimensions of the pattern of the wire electrodes 44a of the second patterned electrode 44 are as follows. For example, the wire width L2 may be 1 μm to 100 μm, the height H2 may be 50 nm to 100 μm, and the pitch P2 may be 100 μm to 2500 μm. When the pitch P2 is in the above range, light is uniformly emitted from the entire surface of the second area 52 constituted by the second patterned electrode 44 including the openings 41.

The dimensions of the first patterned electrode 43 and the second patterned electrode 44 are not limited to the above ranges and may be suitably set in accordance with the planar size of the luminescent element 6.

For example, the wire width L1 of the first patterned electrode 43 and the wire width L2 of the second patterned electrode 44 may be decreased in view of utilization efficiency of light emitted from the emitting layer 32. On the other hand, the wire width L1 and the wire width L2 may be increased in order to suppress the luminance unevenness by decreasing the resistance of the second electrode layer 40. Therefore, the wire width L1 and the wire width L2 may be suitably set in accordance with, for example, the planar size of the luminescent element 6.

The height H1 of the first patterned electrode 43 and the height H2 of the second patterned electrode 44 may be 100 nm to 10 μm in view of, for example, a decrease in the resistance of the second electrode layer 40, the material usage efficacy in the formation by the coating method, and the radiation angle of light radiated from the functional layer 30.

As shown in FIG. 4B, the minimum distance X1 between the first patterned electrode 43 and the second patterned electrode 44, that is, the minimum distance X1 between the wire electrodes 43a and the wire electrodes 44a may be, for example, 2500 μm or more and 5000 μm or less. When the minimum distance X1 is within the range, an electric current flowing between the first area 51 and the second area 52 can be decreased to a negligible value, which allows the luminescent areas to independently emit light. Herein, the minimum distance X1 is not limited to the above range and may be suitably set in accordance with, for example, the electrical conductivity of the transparent conductive layer 39, the patterns of the first patterned electrode 43 and the second patterned electrode 44, and the contact resistance between the transparent conductive layer 39 and the first patterned electrode 43 and between the transparent conductive layer 39 and the second patterned electrode 44. In short, the minimum distance X1 is a distance which can electrically separate the first patterned electrode 43 and the second patterned electrode 44 to the extent that the first area 51 and the second area 52 can be made to independently emit light. In the luminescent element 6 according to this embodiment, each of the openings 41 in the patterned electrode 42 may have a sectional shape in which, as shown in FIG. 4A, the opening area gradually increases as the distance from the functional layer 30 increases. Thus, the angle of divergence of the light emitted from the functional layer 30 can be increased and the luminance unevenness of the luminescent element 6 can be further suppressed. Furthermore, the reflection loss and absorption loss at the patterned electrode 42 can be suppressed and thus the external quantum efficiency can be further improved.

The shape of each of the openings 41 of the patterned electrode 42 in plan view is not limited to a square and may be, for example, a rectangle, a regular triangle, or a regular hexagon. The first patterned electrode 43 and the second patterned electrode 44 may have, for example, a comb-shaped pattern. Alternatively, a plurality of comb-shaped patterns may be combined with each other. In the first patterned electrode 43 and the second patterned electrode 44, the number of the openings 41 is also not particularly limited and may be plural or one. For example, the number of the openings 41 may be one when the wire electrodes 43a and 44a of the patterned electrode 42 have a comb-shaped pattern or when two comb-shaped patterns are combined with each other.

In FIG. 4B, the end portion of the first patterned electrode 43 on the third area 53 side has a shape in which portions of the wire electrodes 43a that extend in a horizontal direction protrude, but does not necessarily have such a shape. For example, a portion of the wire electrodes 43a that extend in a vertical direction may be located at the end portion. In this case, the outline of the luminescent area is further smoothened. The same applies to the second patterned electrode 44.

Leader Lines 46 and 47 and Terminals 48 and 49

In this embodiment, the first and second leader lines 46 and 47 and the first and second terminals 48 and 49 are made of the same material as the patterned electrode 42 of the second electrode layer 40. However, the material is not particularly limited. When the same material is used, the first and second leader lines 46 and 47, the first and second terminals 48 and 49, and the patterned electrode 42 can be simultaneously formed. The structure of the first and second terminals 48 and 49 is not limited to a single layer structure and may be a laminated structure including two or more layers.

Sealing Substrate 70

The sealing substrate 70 functions as a cover substrate. In this embodiment, the sealing substrate 70 is a glass substrate, but is not limited thereto and may be a plastic substrate or the like. The glass substrate may be made of, for example, soda-lime glass or alkali-free glass. The plastic substrate may be made of a material such as polyethylene terephthalate, polyethylene naphthalate, polyethersulfone, or polycarbonate. When the substrate 10 is a glass substrate, the sealing substrate 70 may also be a glass substrate.

In this embodiment, the sealing substrate 70 is a flat substrate, but is not limited thereto. For example, the sealing substrate 70 may have a recess for accommodating a multilayer film including the functional layer 30 and the second electrode layer 40. This provides an advantage in that there is no need to additionally use the frame unit 80.

Frame Unit 80

The frame unit 80 may be made of, for example, polyimide, novolac resin, or epoxy resin.

A first bonding material used for bonding the frame unit 80 to the upper surface of the substrate 10 is an epoxy resin, but is not limited thereto and may be an acrylic resin or the like. The epoxy resin or acrylic resin used as the first bonding material may be, for example, an ultraviolet-curable resin or a thermosetting resin. The first bonding material may be a material prepared by adding a filler (e.g., silica and alumina) to an epoxy resin.

The same material as the first bonding material is used as a second bonding material used for bonding the frame unit 80 to the sealing substrate 70.

Insulating Layer 60

The insulating layer 60 may be made of, for example, polyimide, novolac resin, or epoxy resin. The insulating layer 60 may be formed by, for example, a screen printing method or a gravure printing method.

Method for Manufacturing Luminescent Element 6

Hereafter, a method for manufacturing the luminescent element 6 will be described with reference to FIGS. 8A to 8E and 9A to 9C. FIGS. 8A to 8E and 9A to 9C are schematic views showing steps in the method for manufacturing the luminescent element 6.

Figure 8A:
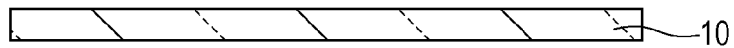
FIGS. 8A to 8E show a manufacturing process of the luminescent element according to the first embodiment.
Figure 8B:
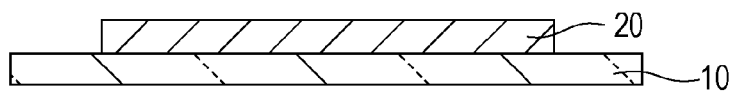

A first electrode layer 20 is formed on one surface of a substrate 10 by a vapor deposition method or a coating method (FIGS. 8A and 8B).

Figure 8C:
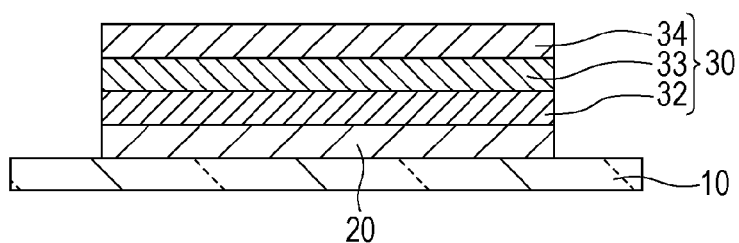

An ink is then applied onto the first electrode layer 20 by a coating method (e.g., a spin coating method, a spray coating method, a die coating method, a gravure printing method, or a screen printing method) and dried to form an emitting layer 32. Furthermore, a second carrier transport layer 33 (hole transport layer) and a second carrier injection layer 34 (hole injection layer) are formed in the same manner (FIG. 8C).

Figure 8D:
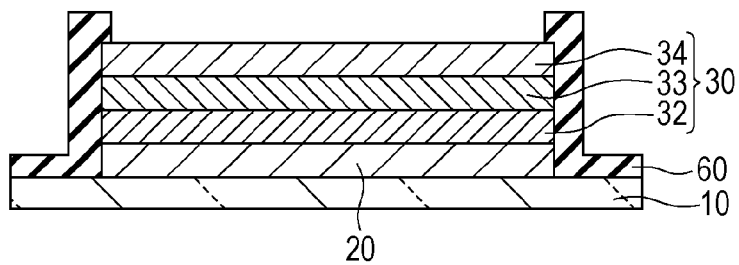

An ink is then applied onto a peripheral portion of the functional layer 30 by, for example, a screen printing method or a gravure printing method and dried to form an insulating layer 60 (FIG. 8D).

Figure 8E:
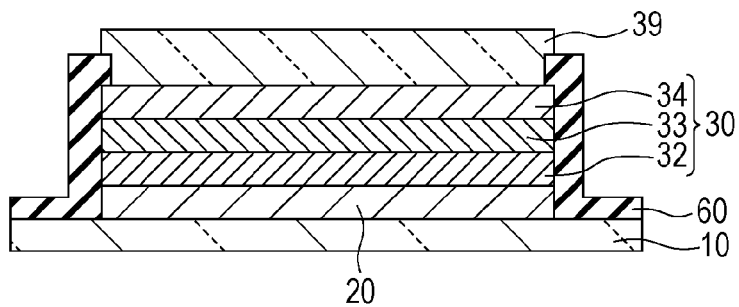

An ink is then applied onto the hole injection layer 34 by a coating method and dried to form a transparent conductive layer 39 (FIG. 8E).

Figure 9A:
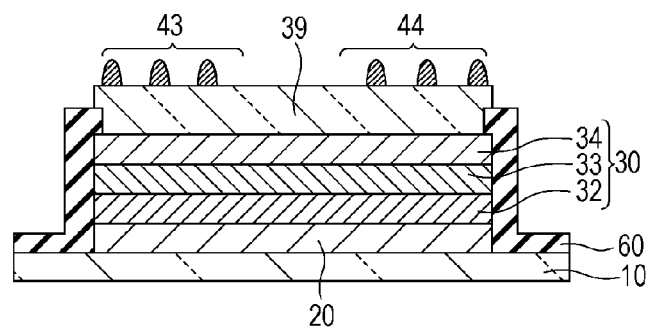
FIGS. 9A to 9C show a manufacturing process of the luminescent element according to the first embodiment.

An ink is then applied onto the transparent conductive layer 39 by, for example, a coating method and dried to form a first patterned electrode 43 and a second patterned electrode 44 in a grid-like manner (FIG. 9A).

Figure 9B:
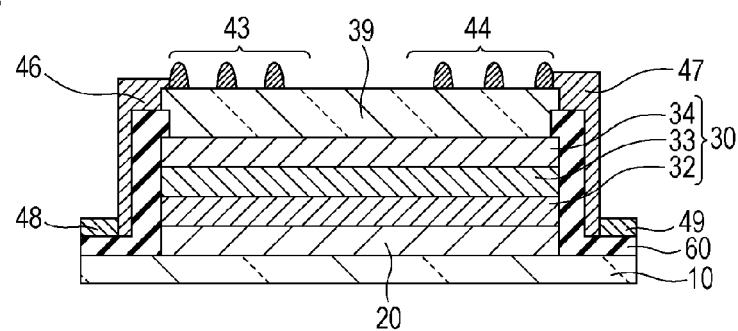

An ink is then applied onto a left peripheral portion of an upper surface of the substrate 10 by a coating method and dried to form a first leader line 46 so that the first leader line 46 is in contact with the first patterned electrode 43 and the transparent conductive layer 39. A first terminal 48 is simultaneously formed on the left peripheral portion of the upper surface of the substrate 10 so as to be connected to the first leader line 46. Furthermore, a second leader line 47 is formed on a right peripheral portion of the upper surface of the substrate 10 so as to be in contact with the second patterned electrode 44 and the transparent conductive layer 39 in the same manner. A second terminal 49 is also formed on the right peripheral portion of the upper surface of the substrate 10 so as to be connected to the second leader line 47 (FIG. 9B).

Figure 9C:
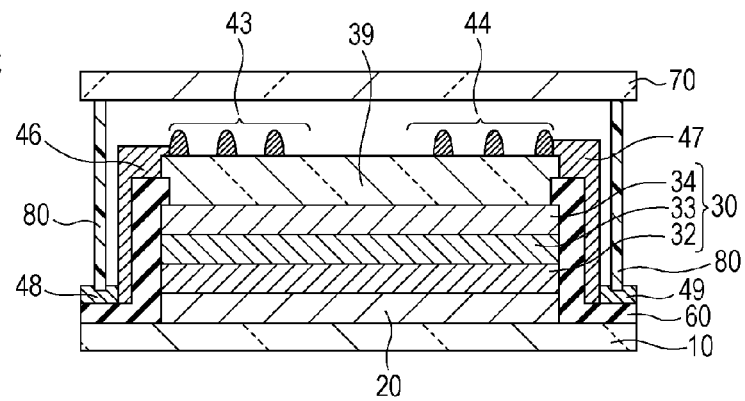

A frame unit 80 is then bonded to the peripheral portion of the substrate 10. Furthermore, a sealing substrate 70 is bonded to an upper surface of the frame unit 80 (FIG. 9C).

Through the above steps, the luminescent element 6 is completed.

Basic Operation of Lighting Device 1

A user turns on the lighting device 1 with a power-on switch SW1 and selects a luminescent area with a luminescent area-selecting switch SW2. Each time the user operates the switch SW2, the luminescent area changes to the first area 51, the second area 52, and the first and second areas 51 and 52 in sequence.

When the luminescent area is selected (hereafter referred to as a "selected luminescent area"), the drive circuits 7A and 7B supply a direct-current power to the luminescent area 6 through the wiring line 5 in accordance with the selected luminescent area.

Specifically, when the drive circuit 7A is driven, a direct current is supplied to a path that extends from the first patterned electrode 43 and the transparent conductive layer 39 present in the first area 51 in the second electrode layer 40 of the luminescent element 6 to the first electrode layer 20. When the drive circuit 7B is driven, a direct current is supplied to a path that extends from the second patterned electrode 44 and the transparent conductive layer 39 present in the second area 52 in the second electrode layer 40 of the luminescent element 6 to the first electrode layer 20. When the drive circuit 7A and the drive circuit 7B are each independently driven, an electric current can be independently supplied to the first patterned electrode 43 and the second patterned electrode 44 (corresponding to the first area 51 and the second area 52) of the luminescent element 6.

Thus, in the luminescent element 6, light can be selectively emitted from the first area 51 and the second area 52. According to this embodiment described above, there is no need to pattern the transparent conductive layer 39, which can reduce the cost of the luminescent element 6. Furthermore, if the transparent conductive layer 39 is patterned, the refractive-index step is generated in end portions of the transparent conductive layer 39 and the outline of the transparent conductive layer may be visually recognized in a light-off state. However, since the transparent conductive layer is continuously formed in this embodiment, luminescent areas are not easily distinguished when the luminescent surface is viewed from the outside in a light-off state. Therefore, the luminescent surface becomes visually uniform and the designability can be improved. Furthermore, since the transparent conductive layer in contact with the functional layer is not patterned, the damage to the functional layer due to the patterning can be reduced and thus a luminescent element having high stability can be manufactured.

Second Embodiment

Hereafter, a luminescent element 61 according to a second embodiment will be described. The luminescent element 61 according to this embodiment is different from the luminescent element 6 according to the first embodiment in that a patterned insulation portion 45 is disposed in the third area 53. Other structures are the same as those of the first embodiment and the descriptions thereof are omitted.

Figure 10A:
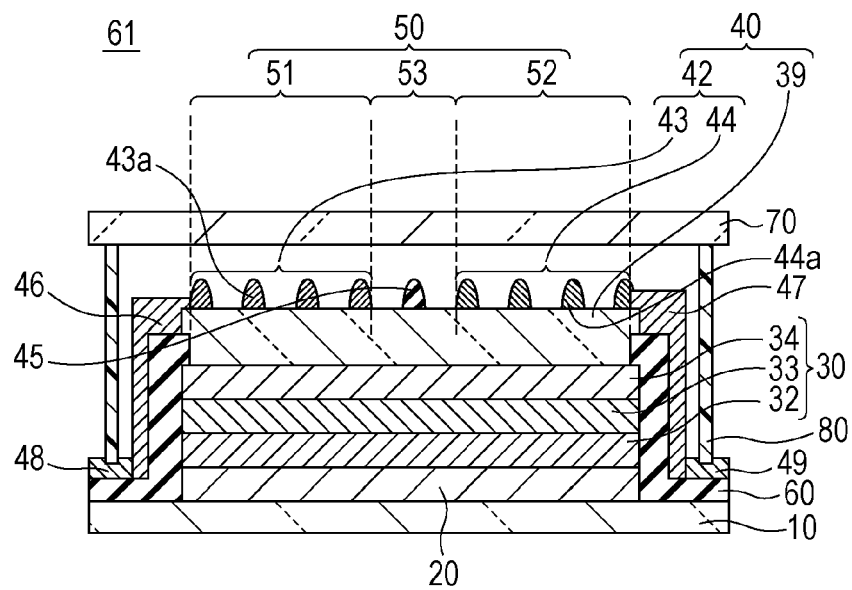
FIG. 10A is a cross-sectional view showing an internal configuration of a luminescent element according to a second embodiment.
Figure 10B:
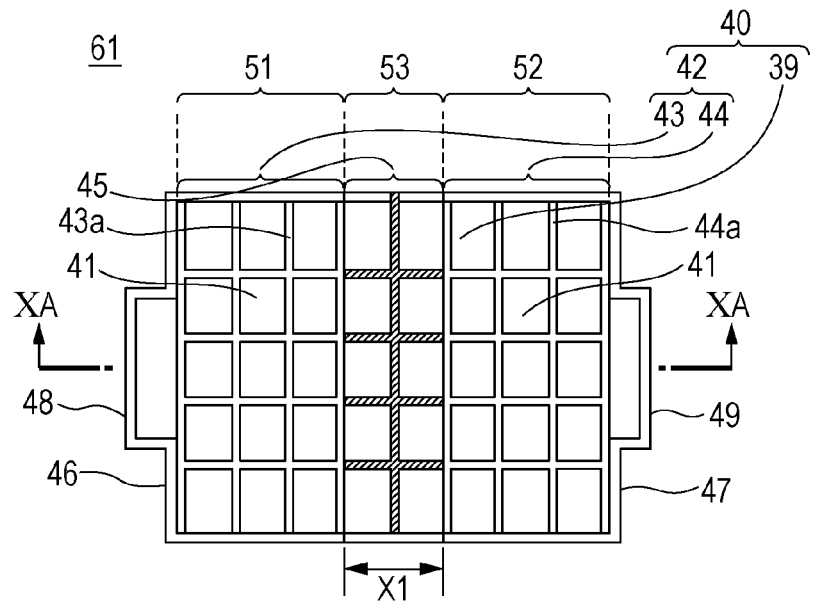
FIG. 10B is a plan view showing the internal configuration of the luminescent element according to the second embodiment.

FIGS. 10A and 10B are schematic views showing an internal configuration of the luminescent element 61 according to the second embodiment. FIG. 10A is a cross-sectional view taken along line XA-XA of FIG. 10B. FIG. 10B is a plan view showing a state excluding a sealing substrate and a frame unit.

As shown in FIGS. 10A and 10B, the luminescent element 61 includes a patterned insulation portion 45 which has an insulating property, has openings, and is disposed on the transparent conductive layer 39 in the third area 53. As shown in FIG. 10B, linear parts of the first patterned electrode 43 which extend in a vertical direction, linear parts of the patterned insulation portion 45 that extend in a vertical direction, and linear parts of the second patterned electrode 44 that extend in a vertical direction are disposed so as to be substantially equally spaced from each other in a horizontal direction. Furthermore, linear parts of the patterned insulation portion 45 that extend in a horizontal direction are disposed so as to be connected to linear parts of the first patterned electrode 43 and the second patterned electrode 44 that extend in a horizontal direction. As described above, the patterned insulation portion 45 is disposed so that the pattern is connected to the patterns of the first patterned electrode 43 and the second patterned electrode 44.

The patterned insulation portion 45 has an insulating property and does not function as an electrode. The patterned insulation portion 45 can be formed by, for example, printing a paste (printing ink) prepared by mixing an organic binder and an organic solvent in a pigment powder using a screen printing method, a gravure printing method, or the like. A pigment with the same color as that of the electrode pattern does not reveal the boundaries. Examples of the organic binder include acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, diallyl phthalate resin, cellulose resin, polyvinyl chloride, polyvinylidene chloride, polyvinyl acetate, and other thermoplastic resins. A copolymer of two or more of monomers that constitute the above resins may be used. The organic binder is not limited thereto.

The luminescent element 61 having the above structure allows a plurality of luminescent areas on a single substrate to independently and selectively emit light. Furthermore, since the pattern of the patterned insulation portion 45 is connected to the patterns of the first patterned electrode 43 and the second patterned electrode 44, the boundaries between the luminescent areas are not easily visually recognized when the luminescent surface is viewed in a light-off state. This provides a uniform appearance and the designability can be improved.

Third Embodiment

Hereafter, a luminescent element 62 according to a third embodiment will be described. The luminescent element 62 according to this embodiment is different from the luminescent element 6 according to the first embodiment in that an insulating layer 601 is disposed on the transparent conductive layer 39 and the first patterned electrode 43 and the second patterned electrode 44 are disposed so as to overlap the insulating layer 601. Other structures are the same as those of the luminescent element 6 according to the first embodiment and the descriptions thereof are omitted.

Figure 11A:
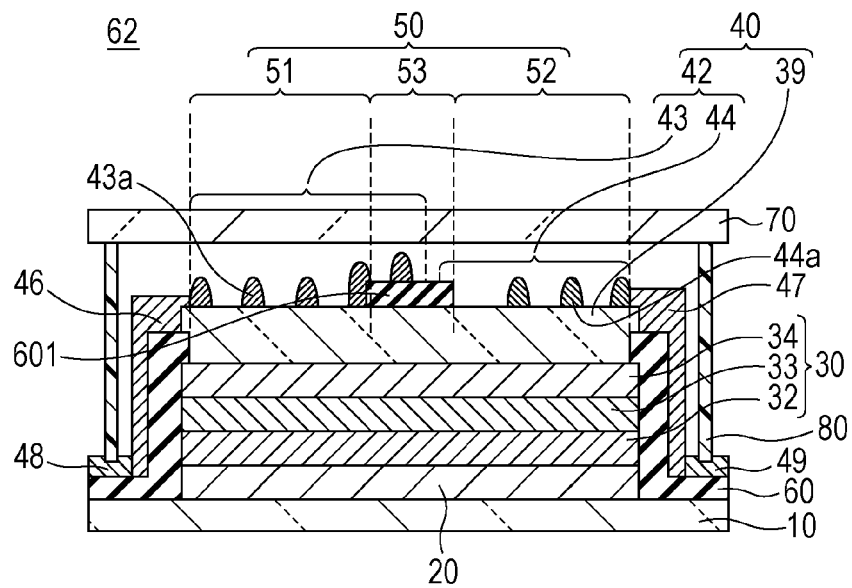
FIG. 11A is a cross-sectional view showing an internal configuration of a luminescent element according to a third embodiment.
Figure 11B:
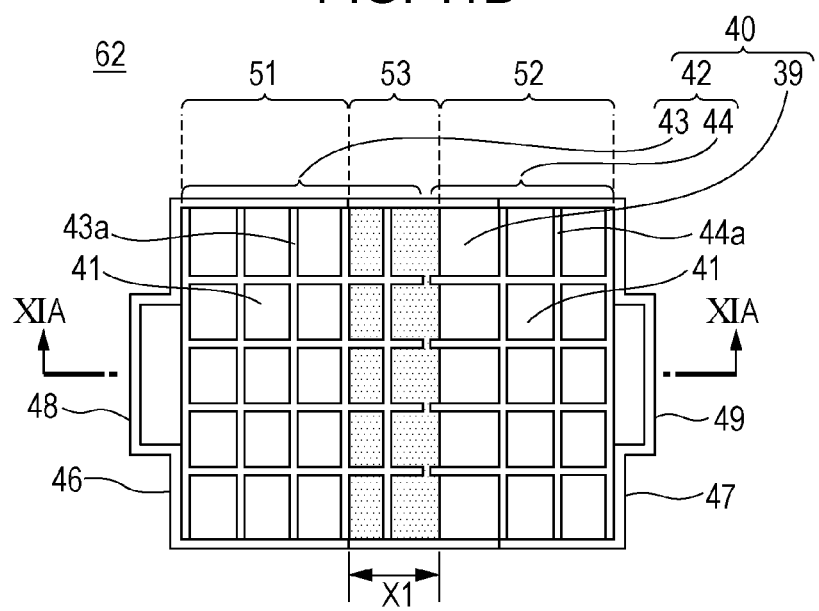
FIG. 11B is a plan view showing the internal configuration of the luminescent element according to the third embodiment.

FIGS. 11A and 11B are schematic views showing an internal configuration of the luminescent element 62 according to the third embodiment. FIG. 11A is a cross-sectional view taken along line XIA-XIA of FIG. 11B. FIG. 11B is a plan view showing a state excluding a sealing substrate and a frame unit. Other structures are the same as those of the first embodiment and the descriptions thereof are omitted.

As shown in FIGS. 11A and 11B, the luminescent element 62 includes a belt-shaped insulating layer 601 having an insulating property on the transparent conductive layer 39 in the third area 53. The insulating layer 601 is continuously disposed in the third area 53 so as to extend along the boundaries with the first area 51 and the second area 52.

The insulating layer 601 may be made of, for example, polyimide, novolac resin, or epoxy resin. The insulating layer 601 may be formed by, for example, a screen printing method or a gravure printing method.

The first patterned electrode 43 is disposed so as to overlap an upper surface of the insulating layer 601. Similarly, the second patterned electrode 44 is disposed so as to overlap an upper surface of the insulating layer 601. The first patterned electrode 43 and the second patterned electrode 44 disposed so as to overlap the insulating layer 601 are separated from each other with a predetermined distance therebetween.

Parts of the first patterned electrode 43 and the second patterned electrode 44 disposed so as to overlap the insulating layer 601 are not directly in contact with the transparent conductive layer 39. Therefore, such parts do not function as auxiliary electrodes. That is, such parts are only present as dummy electrodes that do not function as electrodes. Therefore, even if the distance between the first patterned electrode 43 and the second patterned electrode 44 is smaller than the minimum distance X1 in the first embodiment, the luminescent areas can be separated from each other with certainty. By decreasing the distance between the first patterned electrode and the second patterned electrode to the extent that the distance cannot be visually recognized, the separation section between the first patterned electrode 43 and the second patterned electrode 44 can be obscured. For example, the distance between the first patterned electrode 43 and the second patterned electrode 44 may be set to be 100 µm or more and 2000 µm or less.

In the luminescent element 62 having the above structure according to this embodiment, in addition to the effects of the luminescent element 6 according to the first embodiment, the boundaries between the luminescent areas are not easily visually recognized when the luminescent surface is viewed in a light-off state. This provides a uniform appearance and the designability can be improved.

Modified Example 1

In the luminescent element 62 according to the third embodiment, both the first patterned electrode 43 and the second patterned electrode 44 are disposed so as to overlap the insulating layer 601. However, only one of the first patterned electrode 43 and the second patterned electrode 44 may be disposed so as to overlap the insulating layer 601.

Figure 12A:
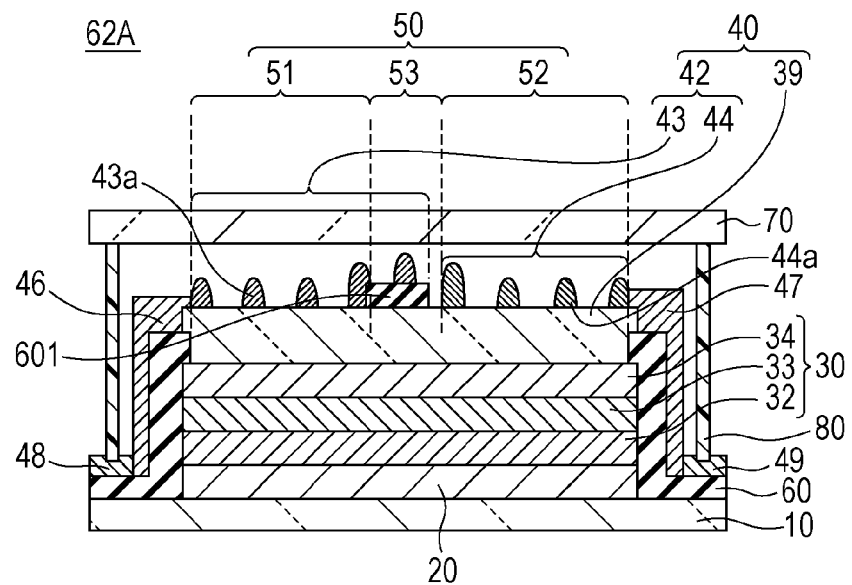
FIG. 12A is a cross-sectional view showing an internal configuration of a luminescent element according to a modified example 1 of the third embodiment.
Figure 12B:
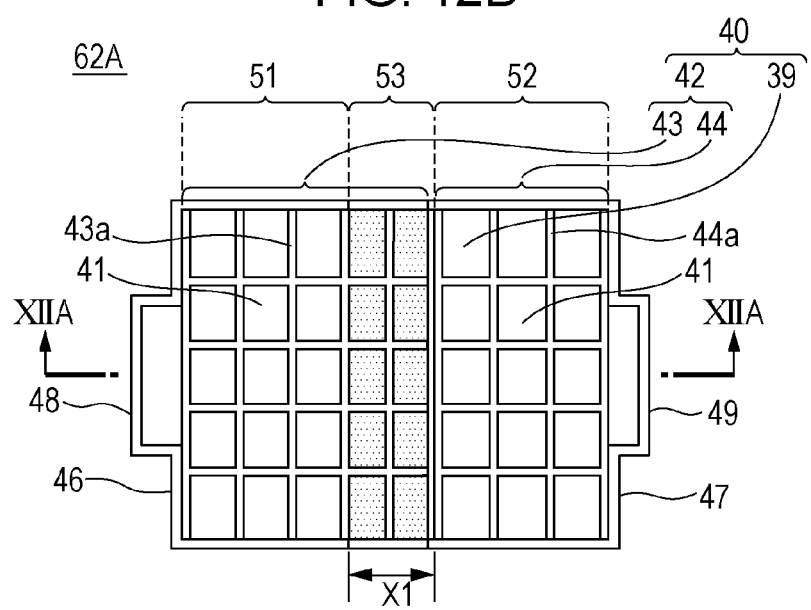
FIG. 12B is a plan view showing the internal configuration of the luminescent element according to the modified example 1 of the third embodiment.

FIGS. 12A and 12B are schematic views showing an internal configuration of a luminescent element 62A according to a modified example 1. FIG. 12A is a cross-sectional view taken along line XIIA-XIIA of FIG. 12B. FIG. 12B is a plan view showing a state excluding a sealing substrate and a frame unit. As shown in FIGS. 12A and 12B, in the luminescent element 62A, only the first patterned electrode 43 is disposed so as to overlap the insulating layer 601 and the second patterned electrode 44 is disposed only on the transparent conductive layer 39 in the second area 52. The first patterned electrode 43 disposed so as to overlap the insulating layer 601 extends to the vicinity of the second area 52. The first patterned electrode 43 and the second patterned electrode 44 are separated from each other with a predetermined distance therebetween.

Even if only one of the first patterned electrode 43 and the second patterned electrode 44 is disposed so as to overlap the insulating layer 601 as in this modified example, the same effects as those of the luminescent element 62 according to the third embodiment are provided.

Fourth Embodiment

Hereafter, a luminescent element 63 according to a fourth embodiment will be described. The luminescent element 63 according to this embodiment is different from the luminescent element 6 according to the first embodiment in that an insulating layer 602 is disposed between the transparent conductive layer 39 and the functional layer 30 in the third area 53. Other structures are the same as those of the luminescent element 6 according to the first embodiment and the descriptions thereof are omitted.

Figure 13A:
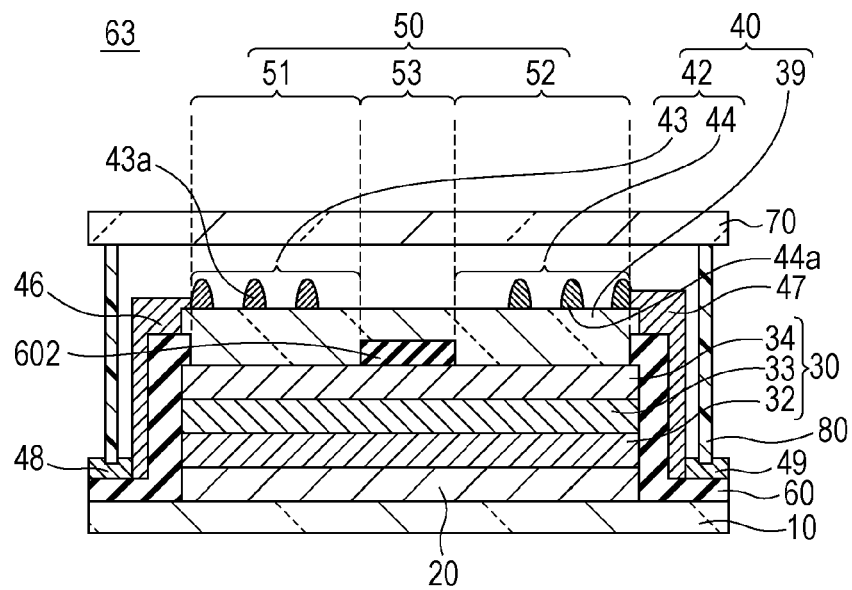
FIG. 13A is a cross-sectional view showing an internal configuration of a luminescent element according to a fourth embodiment.
Figure 13B:
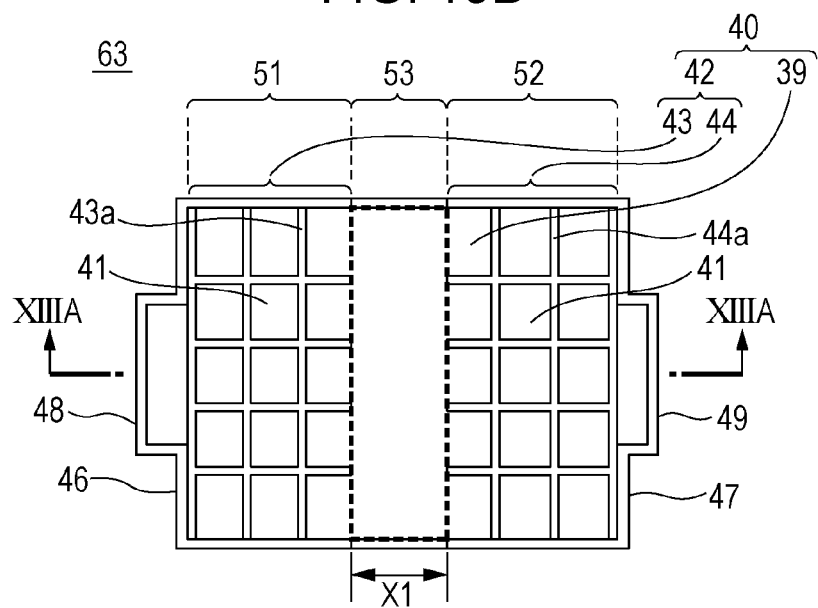
FIG. 13B is a plan view showing the internal configuration of the luminescent element according to the fourth embodiment.

FIGS. 13A and 13B are schematic views showing an internal configuration of the luminescent element 63 according to the fourth embodiment. FIG. 13A is a cross-sectional view taken along line XIIIA-XIIIA of FIG. 13B. FIG. 13B is a plan view showing a state excluding a sealing substrate and a frame unit.

As shown in FIGS. 13A and 13B, the luminescent element 63 includes a belt-shaped insulating layer 602 having an insulating property between the transparent conductive layer 39 and the functional layer 30 in the third area 53. The insulating layer 602 is continuously disposed in the third area 53 so as to extend along the boundaries with the first area 51 and the second area 52.

The insulating layer 602 may be made of the same material as the insulating layer 601 used in the third embodiment.

The presence of the insulating layer 602 can cut off a current path from the transparent conductive layer 39 to the first electrode layer 20 with certainty in a area where the insulating layer 602 is present. Therefore, the light emission in the area where the insulating layer 602 is present can be restricted with certainty. Thus, the outline of the luminescent area can be further sharpened.

The insulating layer 602 may also be formed in part of the first area 51 or the second area 52. In this case, the insulating layer 602 may have an opening with any shape in the first area 51 or the second area 52. When the insulating layer 602 has an opening with any shape, the shape of the luminescent area in the first area 51 or the second area 52 can be freely set.

The position at which the insulating layer 602 is disposed is not limited to a portion between the transparent conductive layer 39 and the functional layer 30. For example, the position may be between the functional layer 30 and the first electrode layer 20. Even if the position is between the layers constituting the functional layer 30 or inside the layers, the same effects are provided.

The insulating layer 602 is not necessarily disposed in the entire third area. There is no need to dispose the insulating layer 602 in a area where almost no light is emitted without forming the insulating layer 602, such as a central portion of the third area.

Modified Examples 2, 3, and 4

The fourth embodiment may be combined with another embodiment or modified example.

Figure 14A:
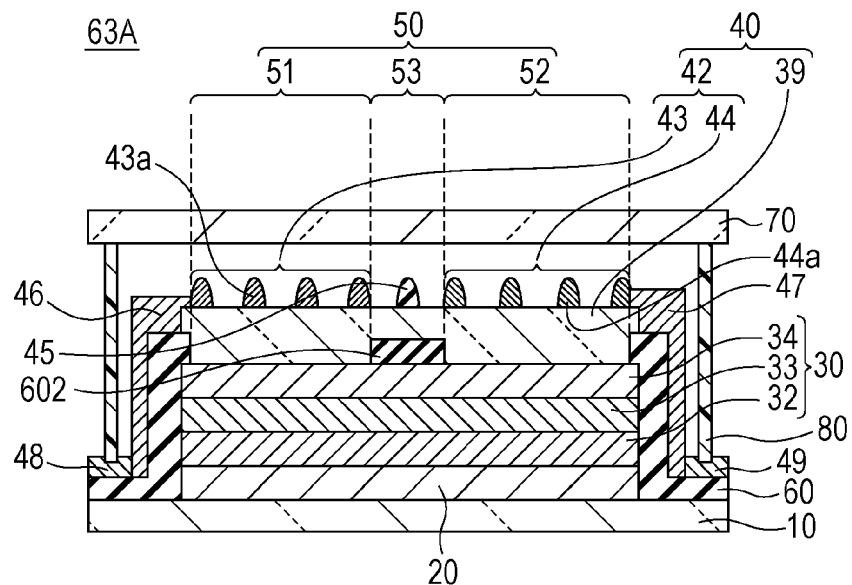
FIG. 14A is a cross-sectional view showing an internal configuration of a luminescent element according to a modified example 2 of the fourth embodiment.
Figure 14B:
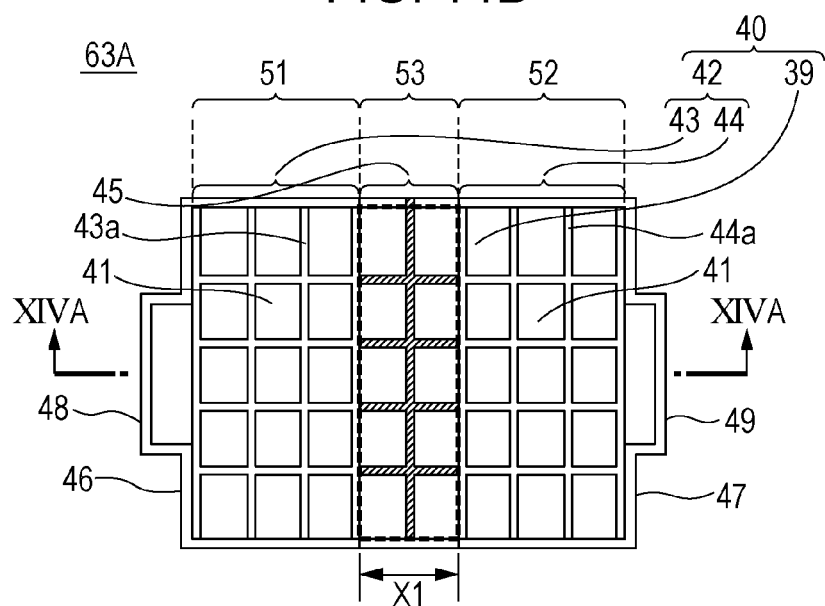
FIG. 14B is a plan view showing the internal configuration of the luminescent element according to the modified example 2 of the fourth embodiment.

FIGS. 14A and 14B are schematic views showing an internal configuration of a luminescent element 63A according to a modified example 2 of the fourth embodiment. FIG. 14A is a cross-sectional view taken along line XIVA-XIVA of FIG. 14B. FIG. 14B is a plan view showing a state excluding a sealing substrate and a frame unit. This modified example provides a structure in which the fourth embodiment and the second embodiment are combined, and thus the effects of both the embodiments can be provided.

Figure 15A:
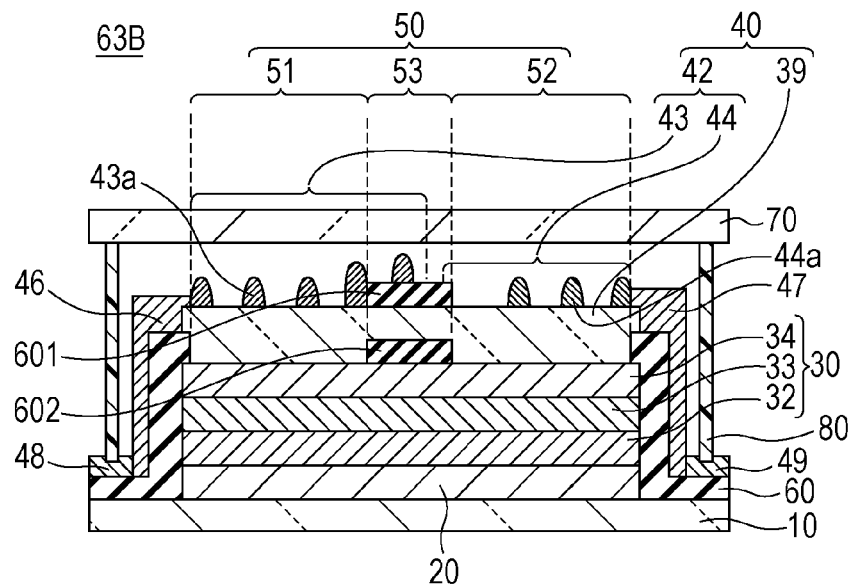
FIG. 15A is a cross-sectional view showing an internal configuration of a luminescent element according to a modified example 3 of the fourth embodiment.
Figure 15B:
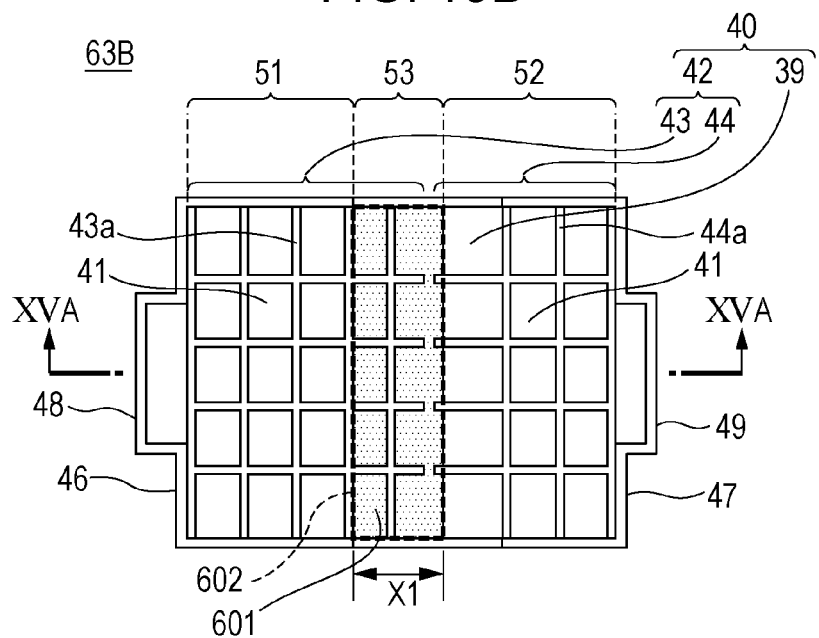
FIG. 15B is a plan view showing the internal configuration of the luminescent element according to the modified example 3 of the fourth embodiment.

FIGS. 15A and 15B are schematic views showing an internal configuration of a luminescent element 63B according to a modified example 3 of the fourth embodiment. FIG. 15A is a cross-sectional view taken along line XVA-XVA of FIG. 15B. FIG. 15B is a plan view showing a state excluding a sealing substrate and a frame unit. This modified example provides a structure in which the fourth embodiment and the third embodiment are combined, and thus the effects of both the embodiments can be provided.

Figure 16A:
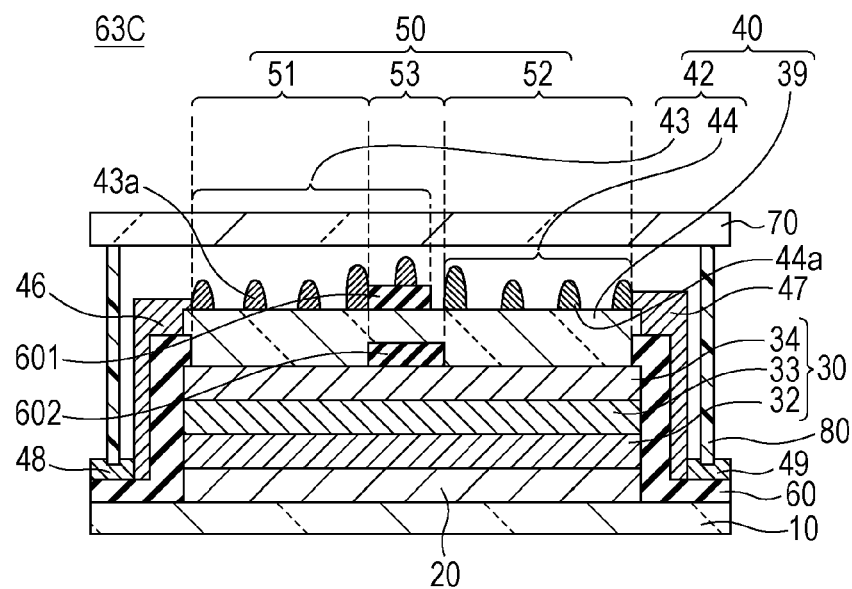
FIG. 16A is a cross-sectional view showing an internal configuration of a luminescent element according to a modified example 4 of the fourth embodiment.
Figure 16B:
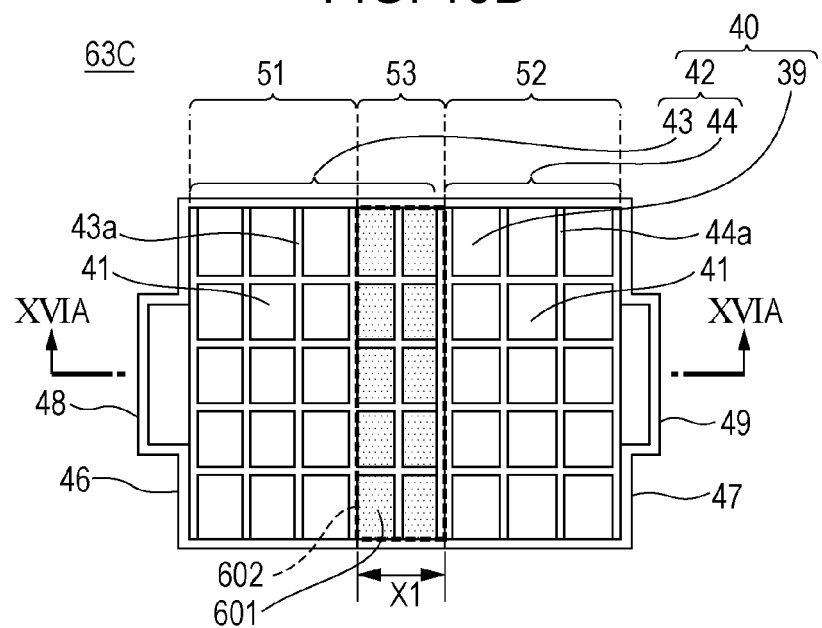
FIG. 16B is a plan view showing the internal configuration of the luminescent element according to the modified example 4 of the fourth embodiment.

FIGS. 16A and 16B are schematic views showing an internal configuration of a luminescent element 63C according to a modified example 4 of the fourth embodiment. FIG. 16A is a cross-sectional view taken along line XVIA-XVIA of FIG. 16B. FIG. 16B is a plan view showing a state excluding a sealing substrate and a frame unit. This modified example provides a structure in which the fourth embodiment and the modified example 1 are combined, and thus the effects of both the embodiment and the modified example can be provided.

Modified Example 5

Figure 17A:
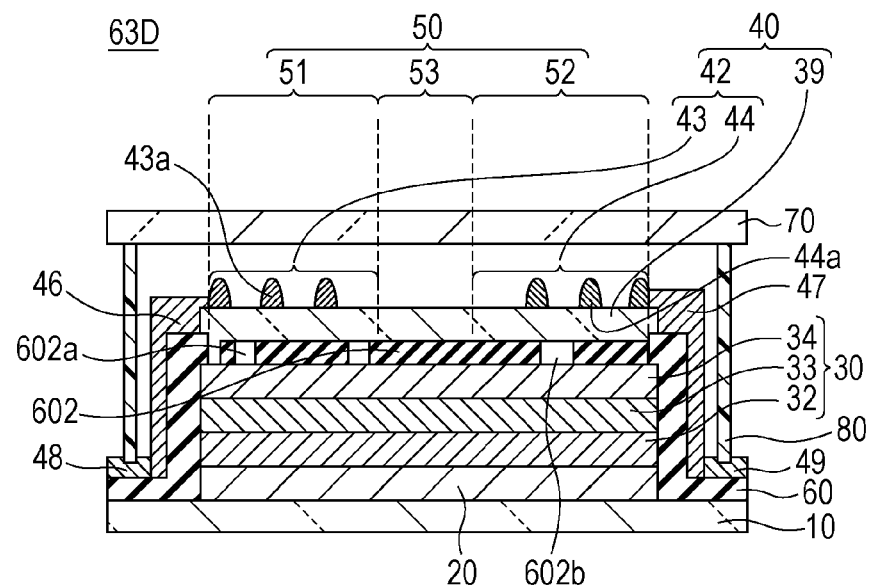
FIG. 17A is a cross-sectional view showing an internal configuration of a luminescent element according to a modified example 5 of the fourth embodiment.
Figure 17B:
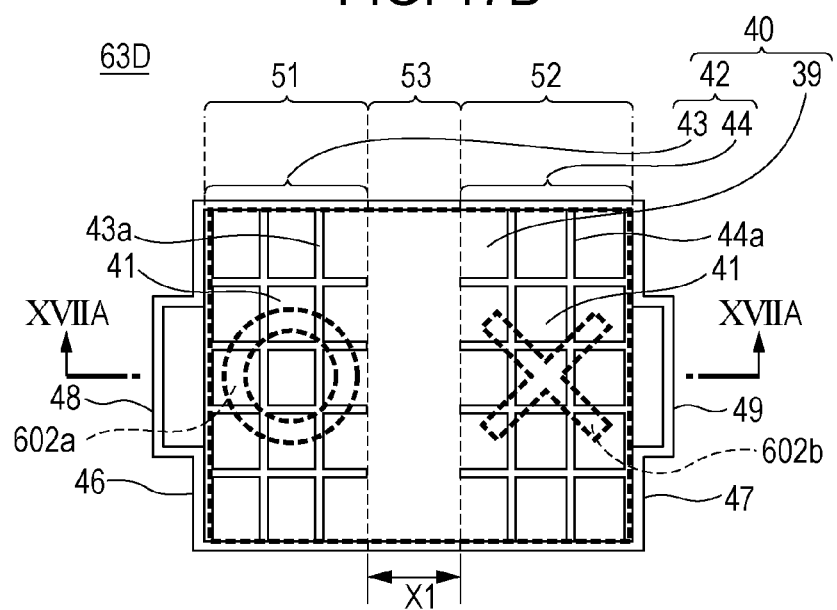
FIG. 17B is a plan view showing the internal configuration of the luminescent element according to the modified example 5 of the fourth embodiment.

FIGS. 17A and 17B are schematic views showing an internal configuration of a luminescent element 63D according to a modified example 5 of the fourth embodiment. FIG. 17A is a cross-sectional view taken along line XVIIA-XVIIA of FIG. 17B. FIG. 17B is a plan view showing a state excluding a sealing substrate and a frame unit. As shown in FIGS. 17A and 17B, the luminescent element 63D includes a second insulating layer 602 having an insulating property between the transparent conductive layer 39 and the functional layer 30 in the first area 51, the second area 52, and the third area 53. The second insulating layer 602 includes openings 602a and 602b in the first area 51 and the second area 52, respectively. The shapes and sizes of the openings 602a and 602b may be freely selected. In this modified example, as shown in FIGS. 17A and 17B, the opening 602a in the first area 51 has a "O" shape and the opening 602b in the second area 52 has a "X" shape. The first area 51 and the second area 52 may each have a plurality of openings.

In the luminescent element 63D according to this modified example, only areas of the openings 602a and 602b with any shape can be made to selectively emit light.

In the luminescent element 63D having the above structure according to this modified example, in addition to the effects of the luminescent element 6 according to the first embodiment, a plurality of informative luminescent areas can be made to each independently emit light. Thus, the luminescent element 63D can also be used as information transmission means.

The first to fourth embodiments and the modified examples described above may be combined with each other as long as the structural contradiction is not made.

Supplementary Matter

Each of the embodiments described above is a preferred example of the present disclosure. The numerical values, the shapes, the materials, the components, the arrangement positions and connecting forms of the components, the steps, the order of the steps, and the like described in the embodiments are merely illustrative and do not limit the present disclosure. Furthermore, among the components described in the embodiments, those which are not described in the independent claims that define the broadest concept of the present disclosure are described as optional components that constitute more desirable forms.

To facilitate the understanding of the disclosure, the scales of the components in the drawings described in the embodiments may be different from the scales of actual components. The present disclosure is not limited to the descriptions of the above embodiments and may be suitably modified without departing from the scope of the present disclosure.

In the luminescent elements and the lighting devices, members such as circuit components and leads are also present on a substrate. However, various embodiments can be made for electrical wiring and electric circuits on the basis of the ordinary knowledge in the technical field and thus the description of the present disclosure does not directly relate to the electrical wiring and the electric circuits. Therefore, the descriptions thereof are omitted. The drawings are all schematic views and are not necessarily illustrated in a precise manner.

The luminescent element of the present disclosure and the lighting device that uses the luminescent element can be widely used for lighting devices for indoor and outdoor use, digital signage and advertising towers in public facilities, and the like. In particular, the luminescent element and the lighting device are useful as light sources in which a plurality of different luminescent areas are made to selectively emit light.

What is claimed is:

1. A luminescent element comprising:
a first electrode layer;
a functional layer including an emitting layer and being disposed on the first electrode layer;
a conductive layer permitting transmission of light and being disposed on the functional layer; and
a first patterned electrode and a second patterned electrode each having an opening and being disposed on the conductive layer to be separated from each other,
wherein the conductive layer extends from a first area in which the first patterned electrode is disposed on the conductive layer to a second area in which the second patterned electrode is disposed on the conductive layer,
the conductive layer is continuously disposed over the first area, the second area, and a third area sandwiched between the first area and the second area,
the luminescent element further comprises a first insulating layer being disposed on the conductive layer in the third area, and
at least one of the first patterned electrode and the second patterned electrode extends to the third area, and an extended portion of the at least one of the first patterned electrode and the second patterned electrode is disposed on the first insulating layer and not on the conductive layer in the third area.

2. A luminescent element comprising:
a first electrode layer;
a functional layer including an emitting layer and being disposed on the first electrode layer;
a conductive layer permitting transmission of light and being disposed on the functional layer; and
a first patterned electrode and a second patterned electrode each having an opening and being disposed on the conductive layer to be separated from each other,
wherein the conductive layer extends from a first area in which the first patterned electrode is disposed on the conductive layer to a second area in which the second patterned electrode is disposed on the conductive layer, the conductive layer is continuously disposed over the first area, the second area, and a third area sandwiched between the first area and the second area, the luminescent element further comprises a patterned insulation portion having an insulating property and being disposed on the conductive layer in the third area, and the patterned insulation portion has a pattern connected to patterns of the first patterned electrode and the second patterned electrode in plan view.

3. A luminescent element comprising:

a first electrode layer;

a functional layer including an emitting layer and being disposed on the first electrode layer;

a conductive layer permitting transmission of light and being disposed on the functional layer; and a first patterned electrode and a second patterned electrode each having an opening and being disposed on the conductive layer to be separated from each other, wherein the conductive layer extends from a first area in which the first patterned electrode is disposed on the conductive layer to a second area in which the second patterned electrode is disposed on the conductive layer, the conductive layer is continuously disposed over the first area, the second area, and a third area sandwiched between the first area and the second area, and the luminescent element further comprises a second insulating layer being disposed between the conductive layer and the first electrode layer in the third area.

4. The luminescent element according to claim 3, wherein the second insulating layer extends to at least one of the first area and the second area and has one or more openings in the at least one of the first area and the second area.

5. The luminescent element according to claim 1, wherein the first electrode layer is a light reflecting electrode.

6. A lighting device comprising:

the luminescent element according to claim 1; and a drive circuit electrically connected to the first patterned electrode and the second patterned electrode and configured to independently supply an electric current to the first patterned electrode and the second patterned electrode.

7. The luminescent element according to claim 2, wherein the first electrode layer is a light reflecting electrode.

8. The luminescent element according to claim 3, wherein the first electrode layer is a light reflecting electrode.

9. A lighting device comprising:

the luminescent element according to claim 2; and a drive circuit electrically connected to the first patterned electrode and the second patterned electrode and configured to independently supply an electric current to the first patterned electrode and the second patterned electrode.

10. A lighting device comprising:

the luminescent element according to claim 3; and a drive circuit electrically connected to the first patterned electrode and the second patterned electrode and configured to independently supply an electric current to the first patterned electrode and the second patterned electrode.

* * * * *